(12) United States Patent
Lee (10) Patent No.: US 8,462,511 B2
(45) Date of Patent: Jun. 11, 2013

(54) STACKED SEMICONDUCTOR PACKAGE (75) Inventor: Seok-Chan Lee, Hwaseong-Si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 333 days.

(21) Appl. No.: 13/005,101

(22) Filed: Jan. 12, 2011

(65) Prior Publication Data
US 2011/0176280 A1 Jul. 21, 2011

(30) Foreign Application Priority Data

Jan. 20, 2010 (KR) ................. 10-2010-0005294

(51) Int. Cl.
*H01L 23/02* (2006.01)

(52) U.S. Cl.
USPC ............ 361/721; 361/720; 361/735; 257/686

(58) Field of Classification Search
USPC ................................... 361/721, 735
See application file for complete search history.

(56) References Cited

U.S. PATENT DOCUMENTS

| | | | | |
|---|---|---|---|---|
| 5,715,144 A * | 2/1998 | Ameen et al. | ................. | 361/790 |
| 6,101,100 A * | 8/2000 | Londa | ............................ | 361/761 |
| 6,861,283 B2 * | 3/2005 | Sharma | ......................... | 438/106 |
| 7,002,805 B2 * | 2/2006 | Lee et al. | ...................... | 361/704 |
| 7,473,993 B2 * | 1/2009 | Baek et al. | ..................... | 257/686 |
| 7,847,382 B2 * | 12/2010 | Pagaila et al. | ................. | 257/684 |
| 7,884,486 B2 * | 2/2011 | Pan et al. | ...................... | 257/777 |
| 7,968,373 B2 * | 6/2011 | Ha et al. | ......................... | 438/109 |
| 8,008,121 B2 * | 8/2011 | Choi et al. | .................... | 438/107 |
| 8,269,323 B2 * | 9/2012 | Khan et al. | .................... | 257/675 |
| 2007/0018312 A1 | 1/2007 | Jo | | |

FOREIGN PATENT DOCUMENTS

| | | |
|---|---|---|
| KR | 200211294 | 11/2000 |
| KR | 20070009150 A | 1/2007 |
| KR | 100698526 A | 3/2007 |

* cited by examiner

*Primary Examiner* — Boris Chervinsky
(74) *Attorney, Agent, or Firm* — Harness, Dickey & Pierce (57) ABSTRACT

A stacked semiconductor package including a first printed circuit board and a second printed circuit board is provided. The first printed circuit board may include a first surface upon which a first semiconductor chip is mounted and a second surface upon which at least one connecting structure is attached. The first printed circuit board may further include at least one thermal via and a heat sink and the at least one thermal via and the heat sink may be disposed under the first semiconductor chip with the heat sink being disposed between the first surface and the second surface. The second printed circuit board may include a third surface upon which a second semiconductor chip is mounted. The second printed circuit board may be disposed under the first printed circuit board with the at least one connecting structure connecting the first printed circuit board to the second printed circuit board.

20 Claims, 5 Drawing Sheets

Fig. 8 ated semiconductor package may be implemented as a stacked semiconductor package, for example, to a stacked semiconductor package including thermal vias.

STACKED SEMICONDUCTOR PACKAGE

CROSS-REFERENCE TO RELATED APPLICATIONS

This U.S. non-provisional patent application claims priority under 35 U.S.C. §119 to Korean Patent Application No. 10-2010-0005294, filed on Jan. 20, 2010, the entire contents of which are hereby incorporated by reference.

BACKGROUND

1. Field

Example embodiments of the inventive concepts relate to a stacked semiconductor package, for example, to a stacked semiconductor package including thermal vias.

2. Background

Recently, a stacked semiconductor package is fabricated by sequentially stacking a lower semiconductor package and an upper semiconductor package to achieve high integration. The lower semiconductor package includes a lower chip stack structure on a lower printed circuit board. The upper semiconductor package includes an upper chip stack structure on an upper printed circuit board. The lower and upper chip stack structures each includes sequentially stacked semiconductor chips. Accordingly, the stacked semiconductor package includes the lower printed circuit board, the lower chip stack structure, the upper printed circuit board, the upper chip stack structure, which are sequentially stacked.

In this case, since the stacked semiconductor package has the upper printed circuit board between the lower chip stack structure and the upper chip stack structure, a process for achieving high integration is limited. This is because the upper printed circuit board is disposed between the lower chip stack structure and the upper chip stack structure, so that it is difficult to reduce the thickness of the stacked semiconductor package. In addition, since the stacked semiconductor package has the lower chip stack structure between the lower printed circuit board and the upper printed circuit board, a process for achieving high integration is limited. This is because as the number of the stacked semiconductor chips of the lower chip stack structure increases, the process defective rate increases between the lower printed circuit board and the upper printed circuit board. Thus, the stacked semiconductor package has poor process tolerances with respect to high integration. This makes it difficult to implement multi-function trend in stacked semiconductor packages.

SUMMARY

The present disclosure provides a stacked semiconductor package that can effectively diffuse heat from semiconductor chips.

In accordance with example embodiments, a stacked semiconductor package may include a first printed circuit board and a second printed circuit board. The first printed circuit board may include a first surface upon which a first semiconductor chip is mounted and a second surface upon which at least one connecting structure is attached. The first printed circuit board may further include at least one thermal via and a heat sink and the at least one thermal via and the heat sink may be disposed under the first semiconductor chip with the heat sink being disposed between the first surface and the second surface. In example embodiments, the second printed circuit board may include a third surface upon which a second semiconductor chip is mounted. The second printed circuit board may be disposed under the first printed circuit board with the at least one connecting structure connecting the first printed circuit board to the second printed circuit board.

Example embodiments of the inventive concepts provide stacked semiconductor packages including: a first printed circuit board including a thermal via and a heat sink under a semiconductor chip which is mounted to the first semiconductor chip; a second printed circuit board being disposed under the first printed circuit board, to which a second semiconductor chip is mounted; a first terminal attached to a lower surface of the first printed circuit board and connecting the first printed circuit board to the second printed circuit board; and a second terminal attached to a lower surface of the second printed circuit board.

BRIEF DESCRIPTION OF THE DRAWINGS

The accompanying figures are included to provide a further understanding of the inventive concepts, and are incorporated in and constitute a part of this specification. The drawings illustrate example embodiments of the inventive concepts and, together with the description, serve to explain principles of the inventive concepts. In the figures.

DETAILED DESCRIPTION OF THE EMBODIMENTS

Example embodiments of the inventive concepts will be described below in more detail with reference to the accompanying drawings. The inventive concepts may, however, be embodied in different forms and should not be construed as limited to the example embodiments set forth herein. Rather, these example embodiments are provided so that this disclosure will be thorough and complete, and will fully convey the scope of the inventive concepts to those skilled in the art.

In the following description, the technical terms are used only to explain a specific example embodiment while not limiting the inventive concepts. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, the example embodiments in the detailed description will be described with sectional views as ideal exemplary views of the inventive concepts. In the figures, the dimensions of layers and regions are exaggerated for clarity of illustration. Accordingly, shapes of the exemplary views may be modified according to manufacturing techniques and/or allowable errors. Therefore, the example embodiments of the inventive concepts are not limited to the specific shape illustrated in the exemplary views, but may include other shapes that may be created according to manufacturing processes. For example, although a region is illustrated as a right-angled region, the etch region may be actually round or have a predetermined curvature. Areas exemplified in the drawings have general properties, and are used to illustrate a specific shape of a device region. Thus, this should not be construed as limited to the scope of the inventive concepts.

Hereinafter, example embodiments of the inventive concepts will be described in detail with reference to the accompanying drawings.

Figure 1:
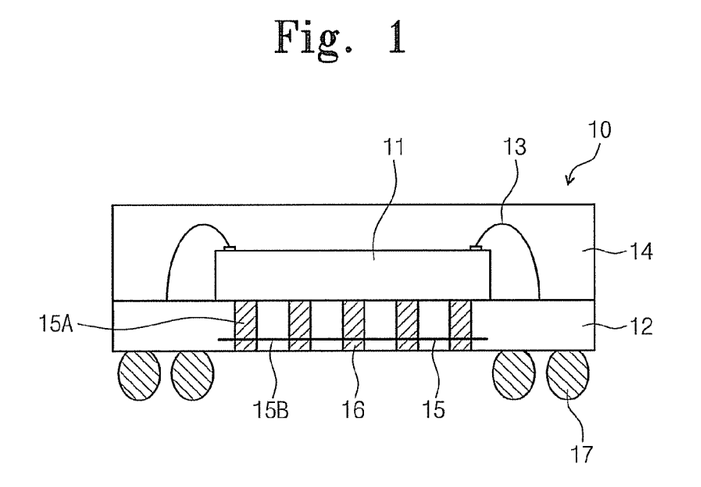
FIG. 1 is a cross-sectional view illustrating a semiconductor package according to example embodiments of the inventive concepts.

FIG. 1 is a cross-sectional view illustrating a semiconductor package 10 according to an example embodiment of the inventive concepts. Referring to FIG. 1, the semiconductor package 10 includes a semiconductor chip 11 in which electronic circuits are integrated, a printed circuit board 12 in which thermal vias 16 and a heat sink 15 are disposed, wires 13 configured to electrically connect the semiconductor chip 11 to the printed circuit board 12, a molding material 14 covering the surface of the printed circuit board 12 on which the semiconductor chip 11 is mounted, to protect the semiconductor chip 11 from the surrounding environment, and solder balls 17 (an example of a connecting structure) attached to the opposite side of the printed circuit board 12 to the side covered with the molding material 14. In this example embodiment, the thermal vias 16 and the heat sink 15 may be arranged in a region of the printed circuit board 12 under the semiconductor chip 11. For example, the molding material 14 may include an epoxy molding compound (EMC). The semiconductor chip 11 may be adjacent to a heat diffusion region provided with a heat diffusion part including the thermal vias 16 and the heat sink 15, and be adhered through epoxy (not shown) to the upper surface of the printed circuit board 12. An active surface of the semiconductor chip 11 provided with semiconductor devices may be directed upward, and be electrically connected through the wires 13 to the printed circuit board 12. Alternatively, the active surface may be brought to face the printed circuit board 12, and the semiconductor chip 11 may be electrically connected to the printed circuit board 12 through an electrical connection member such as solder balls or bumps.

The heat sink 15 may be formed while the printed circuit board 12 is fabricated. The heat sink 15 may include thermal posts 15A and layer 15B. The heat sink 15 may be formed during the fabrication of the printed circuit board 12, by stacking a copper (Cu) layer and a dielectric, and by patterning the copper layer. The heat sink 15 may include a different material from that of a circuit pattern of the printed circuit board 12. The heat sink 15 may be substantially equal or similar to the semiconductor chip 11 in thermal expansion coefficient and Young's modulus, and be substantially greater in thermal conductivity than the printed circuit board 12 or the molding material 14. For example, the layer 15B may include a material having the same coefficient of thermal expansion and Young's modulus as that of the semiconductor chip 11. Thus, the heat diffusion characteristics of the semiconductor package 10 can be improved, and the bending of the semiconductor package 10 can be reduced. The heat sink 15 may include a metal based material, such as copper, copper alloy, or aluminum, having high thermal conductivity. The heat sink 15 may include a lower plate and a protrusion part that protrudes from the center of the lower plate.

Figure 2A:
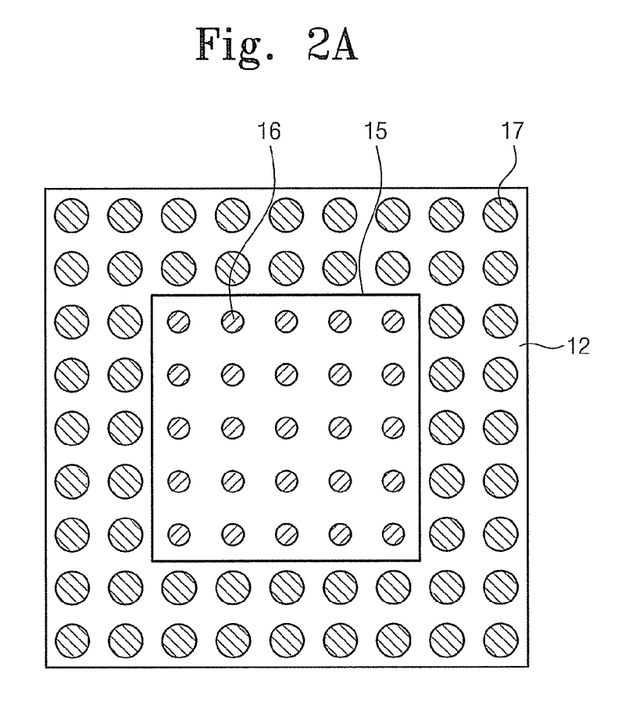
FIGS. 2A, 2B and 2C are schematic views illustrating various heat sinks adapted to be applied to the semiconductor package of FIG. 1.
Figure 2B:
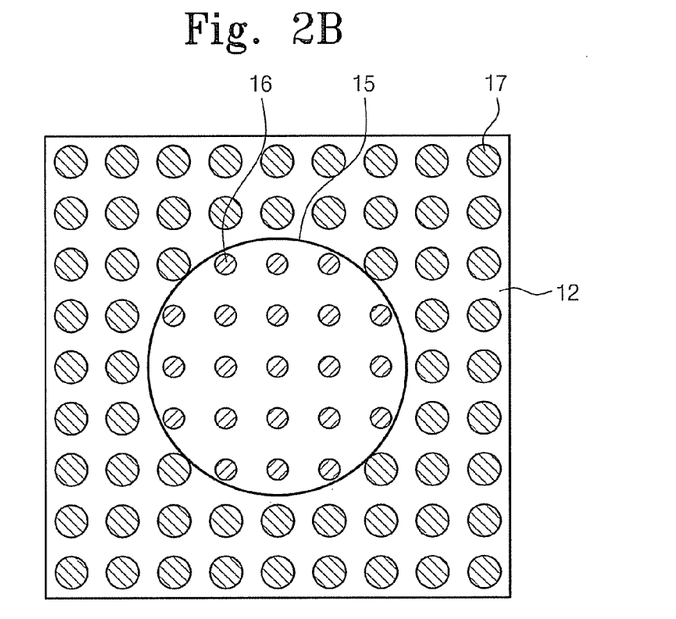
Figure 2C:
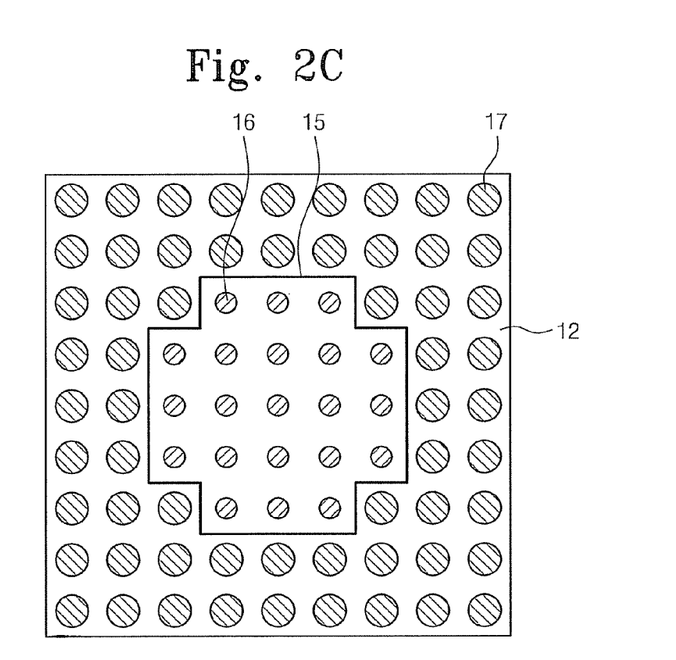

Referring to FIGS. 2A through 2C, the heat sink 15 may have a shape having a large surface area for efficiently transferring heat, for example, a circular shape, a tetragonal shape, an oval shape, and a cross shape, and a combination thereof. The heat sink 15 may have a substantially larger area than those of the thermal vias 16 of the printed circuit board 12, and have a substantially similar area to the area of the printed circuit board 12 on which the semiconductor chip 11 is mounted.

A surface on the upper side of the heat sink 15 may be exposed out of the printed circuit board 12, and thus, may be directly adhered to the semiconductor chip 11 by using epoxy as a medium. To increase adhesive strength, the upper surface of the heat sink 15 may be formed rough, or be treated with a black copper oxide such as CuO or a brown copper oxide such as $Cu_2O$. The lower surface of the heat sink 15 may be plated with solder, palladium (Pd), or nickel (Ni), or bare copper may be used. When bare copper is used, an organic material may be used as a coating material to prevent oxidation occurring during a process.

Holes for the thermal vias 16 may be formed within the heat diffusion region of the printed circuit board 12 through a drilling process, a plating process, and an etching process before or after forming the heat sink 15. The heat sink 15 and the thermal vias 16 may be formed as dummy regions having no electrical function, or may supply power ($V_{ss}$) or function as a ground ($V_{dd}$). The thermal vias 16 may have the substantially same size (diameter of about 0.05 mm to about 0.3 mm) as that of a typical via, and may fill the holes with the substantially same material as that of a typical via. The thermal posts 15A may be formed in a manner similar to that used for forming the thermal vias 16 and may have the same size, material, and arrangement of the thermal vias 16. In example embodiments, the thermal vias 16 may include an insulating material, a plating material, a polymer material having high thermal conductivity, or a conductive polymer material. The thermal vias 16 may have a substantially different size and a substantially different material from those of a typical via to fill the holes and improve the heat transfer characteristics. The typical via is finished with a photosensitive solder resist (PSR) insulating material for preventing oxidation. The thermal vias 16 may be exposed, or another insulating or conductive material may be applied on the thermal vias 16.

The printed circuit board 12 may be a rigid substrate or a flexible substrate. The solder balls 17 disposed at the lower side of the printed circuit board 12 may include one of various metals such as lead (Pb), tin (Sn), silver (Ag), bismuth (Bi), and copper (Cu). The solder balls 17 may have bump shapes instead of ball shapes.

The solder balls 17 may be disposed out of a semiconductor chip region provided with the semiconductor chip 11 (fan-out), or be disposed within the semiconductor chip region (fan-in). Furthermore, the solder balls 17 may be disposed at the lower side of the thermal vias 16 to improve the heat diffusion characteristics.

Figure 3:
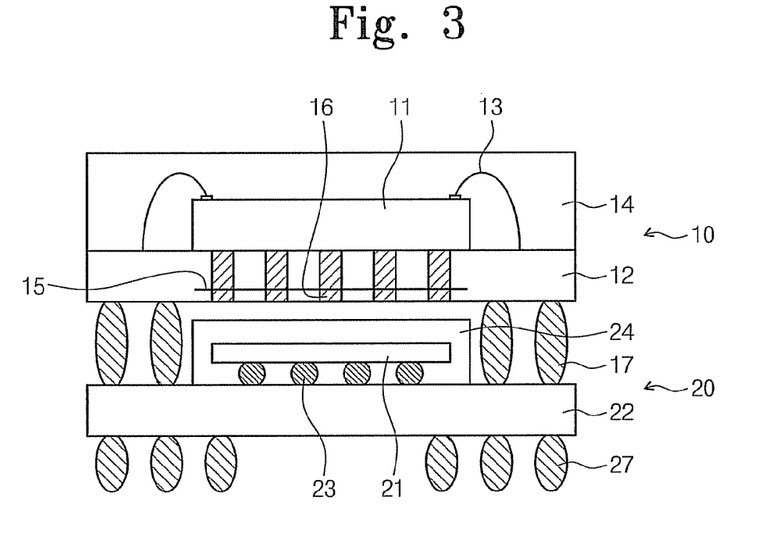
FIG. 3 is a cross-sectional view illustrating a stacked semiconductor package according to an example embodiment of the inventive concepts.

FIG. 3 is a cross-sectional view illustrating a stacked semiconductor package according to an embodiment of the inventive concept. Referring to FIG. 3, an upper semiconductor package 10 is stacked on a lower semiconductor package 20. The upper semiconductor package 10 may have the substantially same structure as that of the semiconductor package described with reference to FIGS. 1 and 2. For example, the upper semiconductor package 10 may include an upper semiconductor chip 11, an upper printed circuit board 12 on which the upper semiconductor chip 11 is mounted, wires 13 configured to electrically connect the upper semiconductor chip 11 to the upper printed circuit board 12, an upper molding material 14 covering the surface of the upper printed circuit board 12 on which the upper semiconductor chip 11 is mounted, to protect the upper semiconductor chip 11 from the surrounding environment, and upper solder balls 17 attached to the opposite side of the upper printed circuit board 12 to the side covered with the upper molding material 14. The upper solder balls 17 may connect the upper semiconductor package 10 to the lower semiconductor package 20.

For example, the lower semiconductor package 20 may include a lower semiconductor chip 21, a lower printed circuit board 22 on which the lower semiconductor chip 21 is mounted, bumps 23, that is, solder joints configured to electrically connect the lower semiconductor chip 21 to the lower printed circuit board 22, a lower molding material 24 covering the surface of the lower printed circuit board 22 on which the lower semiconductor chip 21 is mounted, to protect the lower semiconductor chip 21 from the surrounding environment, and lower solder balls 27 attached to the opposite side of the lower printed circuit board 22 to the side covered with the lower molding material 24. Instead of the bumps 23, a member such as the wires 13 of the upper semiconductor package 10 may electrically connect the lower semiconductor chip 21 to the lower printed circuit board 22.

To absorb heat from the semiconductor chip 11 functioning as a heat source at the upper semiconductor package 10, a heat sink 15 and thermal vias 16 are disposed at the upper printed circuit board 12 to function as heat paths that more rapidly transfer heat from the semiconductor chip 11 to the lower semiconductor package 20 or air. A memory device may be mounted to the upper semiconductor package 10, and a logic device or a controller may be mounted to the lower semiconductor package 20. Since the logic device requires substantially more signal terminals than the memory device does, the lower semiconductor package 20 may be used as a package to which the logic device is mounted, and the upper semiconductor package 10 may be used as a package to which the memory device is mounted. In this case, since a plurality of memory devices, such as a dynamic random memory access (DRAM) and a flash memory, mounted to the upper semiconductor package 10 operate at high speeds, a larger amount of heat is generated from the upper semiconductor package 10 than from the lower semiconductor package 20 to which only the logic device and the controller are mounted, and thus, heat diffusion from the upper semiconductor package 10 is more important. Thus, since the lower semiconductor package 20 may function as a movement passage of heat generated from the upper semiconductor package 10, the thermal vias 16 of the upper semiconductor package 10 may contact the lower molding material (epoxy molding compound) 24 of the lower semiconductor package 20. Alternatively, the lower molding material 24 may be removed from the lower semiconductor package 20. When the lower semiconductor chip 21 of the lower semiconductor package 20 is a flip chip, the lower semiconductor chip 21 is completely exposed without the lower molding material 24 configured to protect the lower semiconductor chip 21, or a material is applied on a portion of the lower semiconductor chip 21 to protect the solder joints as an electrical connection part between the lower semiconductor chip 21 and the lower printed circuit board 22, that is, to protect only the bumps 23. The material for protecting the solder joints fills the lower side of the lower semiconductor chip 21 (an underfill process). If necessary, both the underfill process and a molding process may be performed.

The upper semiconductor package 10 may be coupled to the lower semiconductor package 20 through a reflow process performed on both the upper solder balls 17 of the upper semiconductor package 10 and terminals (not shown) of the lower printed circuit board 22 of the lower semiconductor package 20. In this case, to more securely couple the upper semiconductor package 10 to the lower semiconductor package 20, a predetermined amount of solder (not shown) may be formed on the terminals of the lower printed circuit board 22 before the upper semiconductor package 10 may be coupled to the lower semiconductor package 20.

A method for forming the stacked semiconductor package will now be described according to the current example embodiment. The heat sink 15 and the thermal vias 16 are formed in the upper printed circuit board 12. The upper semiconductor chip 11 is attached through epoxy to the upper surface of the upper printed circuit board 12, and the wires 13 are formed to electrically connect the upper semiconductor chip 11 to the upper printed circuit board 12. The bumps 23 are bonded for electrically connecting the lower semiconductor chip 21 to the lower printed circuit board 22. The surfaces of the printed circuit boards 12 and 22 to which the semiconductor chips 11 and 21 are attached are covered with the molding materials 14 and 24 to protect the upper semiconductor chip 11 and the lower semiconductor chip 21 from the surrounding environment. The solder balls 17 are attached to the opposite side of the upper printed circuit board 12 to the side covered with the molding material 14 to form the upper semiconductor package 10. The upper solder balls 17 of the upper semiconductor package 10 are coupled to the terminals (not shown) of the lower printed circuit board 22 of the lower semiconductor package 20 through the reflow process. The lower solder balls 27 are attached to the opposite side of the lower printed circuit board 22 to the side covered with the molding material 24 to form the stacked semiconductor package.

Figure 4:
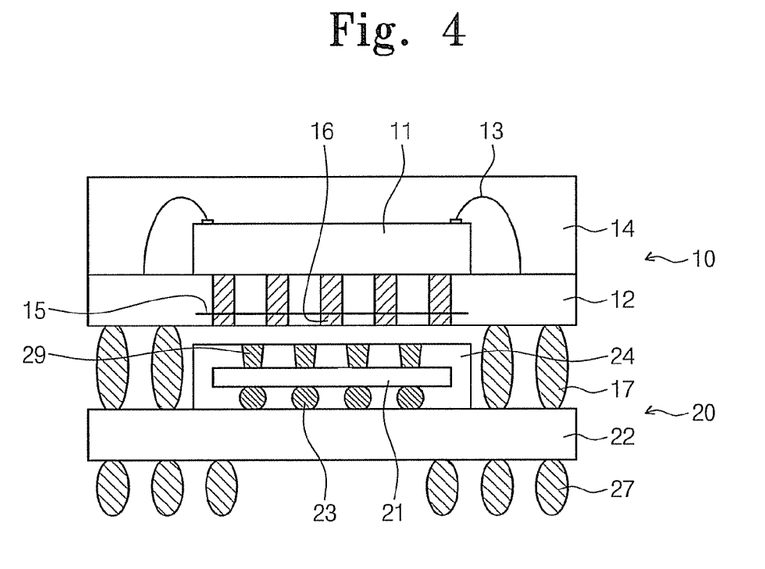
FIG. 4 is a cross-sectional view illustrating a stacked semiconductor package according to another example embodiment of the inventive concepts.

FIG. 4 is a cross-sectional view illustrating a stacked semiconductor package according to another example embodiment of the inventive concepts. Like reference numerals refer to like elements in the current example embodiment and the previous example embodiment described with reference to FIG. 3, and detailed descriptions of the same technical characteristics as those of the previous example embodiment will be omitted in the current example embodiment for the sake of brevity.

Referring to FIG. 4, to improve heat diffusion characteristics, molding vias 29 may be added to the lower semiconductor package 20. The molding vias 29 may be formed by forming via holes in the lower molding material 24 covering the upper portion of the lower semiconductor chip 21 of the lower semiconductor package 20, and then, by filling the via holes with a material having high thermal conductivity. The molding vias 29 may facilitate heat transfer from the upper semiconductor package 10 to the lower semiconductor package 20.

The via holes may be formed using laser or a method such as dry etching. The molding vias 29 may be formed through a process such as electroplating, printing, or dispensing.

The upper semiconductor package 10 may be coupled to the lower semiconductor package 20 through the reflow process performed on both the upper solder balls 17 of the upper semiconductor package 10 and the terminals (not shown) of the lower printed circuit board 22 of the lower semiconductor package 20. In this case, to more securely couple the upper semiconductor package 10 to the lower semiconductor package 20, a predetermined amount of solder (not shown) may be formed on the terminals of the lower printed circuit board 22 before the upper semiconductor package 10 may be coupled to the lower semiconductor package 20.

Figure 5:
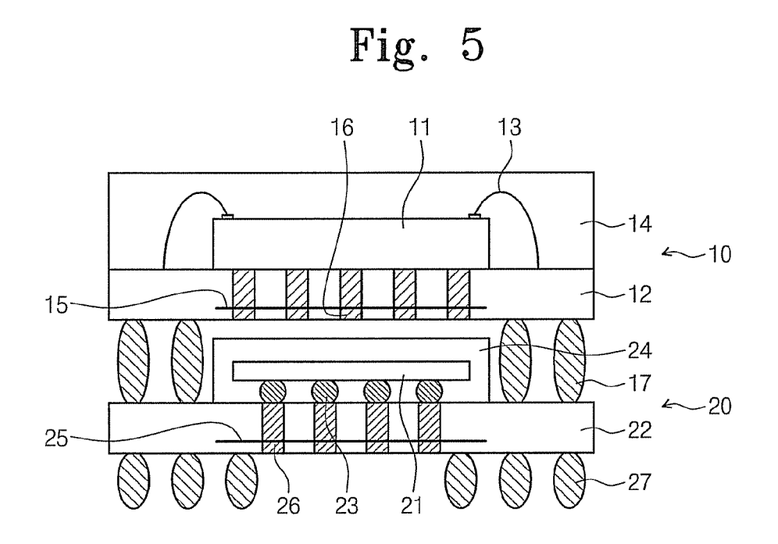
FIG. 5 is a cross-sectional view illustrating a stacked semiconductor package according to another example embodiment of the inventive concepts.

FIG. 5 is a cross-sectional view illustrating a stacked semiconductor package according to another example embodiment of the inventive concepts. Like reference numerals refer to like elements in the current example embodiment and the previous example embodiment described with reference to FIG. 3, and detailed descriptions of the same technical characteristics as those of the previous example embodiment will be omitted in the current example embodiment.

Referring to FIG. 5, the lower semiconductor package 20 is provided with a heat sink 25 and thermal vias 26, which are the same as those of the upper semiconductor package 10, and thus, dissipation of heat from the semiconductor chips 11 and 21 can be significantly improved.

Figure 6:
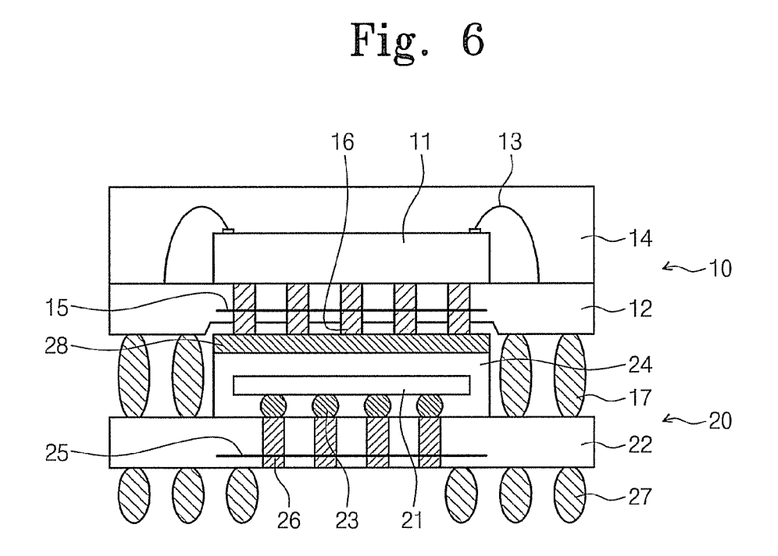
FIG. 6 is a cross-sectional view illustrating a stacked semiconductor package according to another example embodiment of the inventive concepts.

FIG. 6 is a cross-sectional view illustrating a stacked semiconductor package according to another example embodiment of the inventive concepts. Like reference numerals refer to like elements in the current example embodiment and the previous example embodiment described with reference to FIG. 3, and detailed descriptions of the same technical characteristics as those of the previous example embodiment will be omitted in the current example embodiment.

Referring to FIG. 6, an additional heat diffusion material 28 may be disposed between the heat sink 15 of the upper semiconductor package 10 and the lower molding material 24 of the lower semiconductor package 20. The heat diffusion material 28 may be a material that has relatively excellent heat transfer characteristics and is adapted to be formed between the lower semiconductor package 20 and the upper semiconductor package 10, for example, be a thermal interface material (TIM) that may be thermal grease, thermal bond, a thermally conductive silicone pad, thermally conductive tape, a graphite sheet, a thermally conductive phase change material (PCM), or a thermo-plastic TIM.

The thermal interface material may have a thermal conductivity ranging from about 2.78 W/(mK), to about 3.18 W/(mK), and may be dispensed or attached in a tape shape to the upper surface of the lower semiconductor chip 21 of the lower semiconductor package 20, so as to improve the heat diffusion characteristics. A thermo-plastic TIM having a thickness of about 50 μm has relatively excellent heat diffusion characteristics.

In addition, the example embodiment of FIG. 6 includes a recess formed in the bottom surface of the upper printed circuit board 12. The recess may be formed above the lower molding material 24. The thermal vias 16 may be formed to extend into the recess so as to contact the heat diffusion material 28. The recess may allow for a closer spacing between the lower semiconductor chip 21 and the upper semiconductor chip 11.

Figure 7:
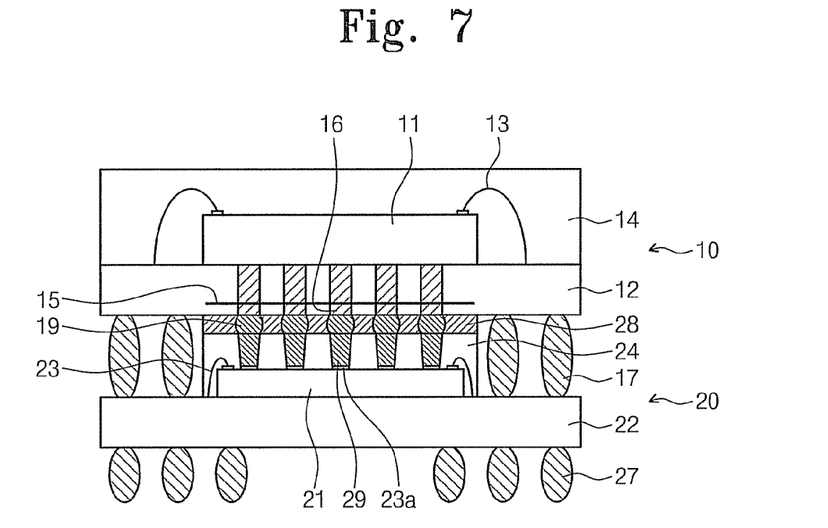
FIG. 7 is a cross-sectional view illustrating a stacked semiconductor package according to another example embodiment of the inventive concepts.

FIG. 7 is a cross-sectional view illustrating a stacked semiconductor package according to another example embodiment of the inventive concepts. Like reference numerals refer to like elements in the current example embodiment and the previous example embodiment described with reference to FIG. 3, and detailed descriptions of the same technical characteristics as those of the previous example embodiment will be omitted in the current example embodiment.

Referring to FIG. 7, to improve heat diffusion characteristics, molding vias 29 may be added to the lower semiconductor package 20. The molding vias 29 may be formed by forming via holes in the lower molding material 24 covering the lower semiconductor chip 21 of the lower semiconductor package 20, and then, by filling the via holes with a material having a relatively high thermal conductivity. The molding vias 29 may facilitate heat transfer from the upper semiconductor package 10 to the lower semiconductor package 20. In addition, sub-solder balls 19 connected to the thermal vias 16 are disposed under the thermal vias 16 of the upper semiconductor package 10 such that the sub-solder balls 19 contact the molding vias 29 of the lower semiconductor package 20, so as to further improve the heat transfer characteristics. In addition, a heat diffusion material 28 may be disposed between the heat sink 15 of the upper semiconductor package 10 and the lower semiconductor chip 21 of the lower semiconductor package 20. The heat diffusion material 28 may be an electrically insulating material. The heat diffusion material 28 may be dispensed or attached in a tape shape to the upper surface of the lower semiconductor chip 21 of the lower semiconductor package 20, so as to further improve the heat diffusion characteristics. In this case, the heat diffusion material 28 may surround the sub-solder balls 19.

Redistribution pads 23a or independent pads may be disposed on the upper most active surface of the lower semiconductor chip 21 of the lower semiconductor package 20. The via holes may be formed through a laser drilling process, and the molding vias 29 may be formed through an electroplating process using the redistribution pads 23a or the independent pads as a seed layer. The redistribution pads 23a may be formed of a conductive material, for example, copper, gold, silver, platinum, or an alloy thereof. Bonding wires 23 that are exemplified as an electrical connection member may electrically connect the redistribution pads 23a to the lower printed circuit board 22 of the lower semiconductor package 20. Alternatively, for example, an upper semiconductor chip on which the redistribution pads 23a have been formed in advance may be stacked at the upper most layer. The redistribution pads 23a may function as media that electrically or thermally connect the lower semiconductor chip 21 of the lower semiconductor package 20 to the upper semiconductor chip 11 of the upper semiconductor package 10. The method of forming the molding vias 29 will now be described in more detail. The lower molding material 24 covering the lower semiconductor chip 21 of the lower semiconductor package 20 is formed. The lower semiconductor chip 21 may be stacked in plurality. For example, the lower molding material 24 may include an epoxy molding compound (EMC). A portion of the lower molding material 24 is removed to form the via holes exposing the redistribution pads 23a disposed on the lower semiconductor chip 21.

When the via holes are formed, a mask process and a photo process are unnecessary, and a laser drilling process that is adapted to rapidly form via holes may be used. When the via holes are formed using the laser drilling process, the via holes may be formed in inclined shapes. In the laser drilling process, when laser is focused on the upper surface of the lower molding material 24, the lower molding material 24 is gradually removed from its upper surface, and moves out of the focus of the laser. Thus, the via holes may have tapered shapes that decrease in width from the upper surface of the lower molding material 24 to the redistribution pads 23a. The upper solder balls 17 of the upper semiconductor package 10 may be inserted into the via holes to form the molding vias 29. Thus, the molding vias 29 may have shapes corresponding to the appearances of the upper solder balls 17. Solder balls remaining between the upper semiconductor package 10 and the lower semiconductor package 20 may be considered as the sub-solder balls 19. That is, the molding vias 29 may have structures continuously extending from the sub-solder balls 19.

The angles between the inner walls of the via holes and the upper surfaces of the redistribution pads 23a may be about 90° or less, for example, range from about 50° to about 90°.

Thus, the upper solder balls 17 can be easily inserted into the via holes. The height of the upper solder balls 17 may be equal to or less than the depth of the via holes such that the upper solder balls 17 inserted in the via holes contact the redistribution pads 23a.

The upper solder balls 17 of the upper semiconductor package 10 may incompletely contact the redistribution pads 23a of the lower semiconductor package 20. For example, the contact between the upper solder balls 17 and the redistribution pads 23a may cause relatively large contact resistance, and further, the upper solder balls 17 may not physically contact the redistribution pads 23a. Thus, a reflow process may be performed to completely and electrically connect the upper solder balls 17 of the upper semiconductor package 10 to the redistribution pads 23a of the lower semiconductor package 20. The reflow process may be performed to form an inter-metal coupled substance or an inter-metal compound between the upper solder balls 17 and the redistribution pads 23a, so that the upper solder balls 17 are completely and electrically connected to the redistribution pads 23a. The reflow process may be performed, for example, at, a temperature ranging from about 200° C. to about 300° C. The upper semiconductor package 10 is electrically connected to the redistribution pads 23a of the lower semiconductor package 20 through the upper solder balls 17, and the redistribution pads 23a of the lower semiconductor package 20 are electrically connected to the lower printed circuit board 22. Thus, the upper semiconductor package 10 is electrically connected to the lower semiconductor package 20 through the upper solder balls 17 and the redistribution pads 23a.

Furthermore, the previous embodiments may be combined to constitute a stacked semiconductor package.

Figure 8:
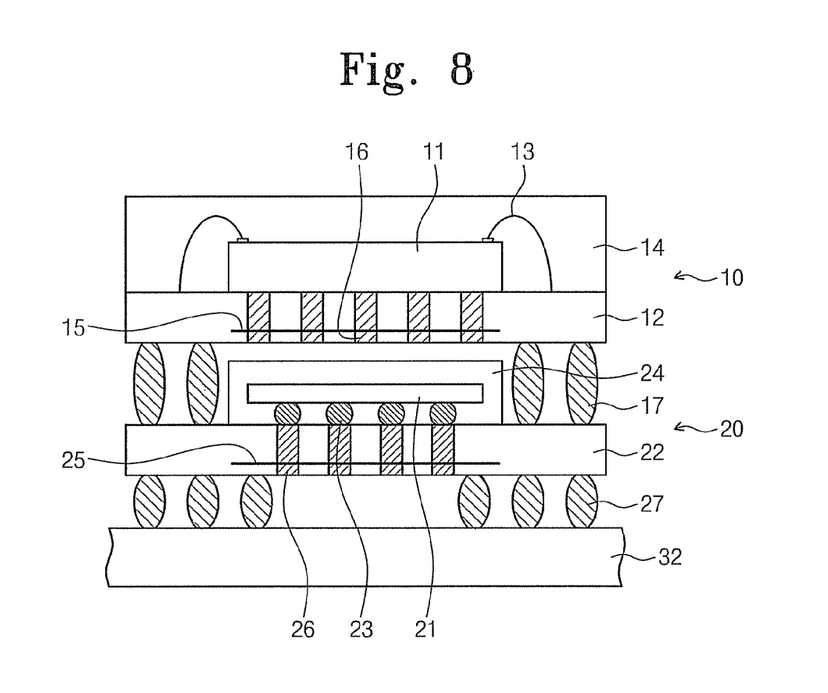
FIG. 8 is a cross-sectional view illustrating a stacked semiconductor package according to another example embodiment of the inventive concepts.

FIG. 8 is a cross-sectional view illustrating a stacked semiconductor package according to another example embodiment of the inventive concepts. Referring to FIG. 8, the above-described stacked semiconductor packages may be mounted to a mother board 32. The mother board 32 may be built into handsets, memory modules, and other mobile electronic appliances. To mount the stacked semiconductor packages to the mother board 32, a predetermined amount of solder is applied on terminals (not shown) disposed on the mother board 32, the stacked semiconductor packages are placed on the terminals, and then, a reflow process in which the mother board 32 with the stacked semiconductor packages passes through a high temperature convection chamber is performed, so that the stacked semiconductor packages can be finally coupled to the mother board 32. A temperature condition of the reflow process may be set according to compositions of both the upper solder balls 17 of the upper semiconductor package 10 and the lower solder balls 27 of the lower semiconductor package 20, and/or according to bending rates of both the upper semiconductor package 10 and the lower semiconductor package 20. When the stacked semiconductor packages are mounted to the mother board 32, a discrete cooling device may be additionally provided to improve heat diffusion characteristics. A cooling fan or an additional heat sink may be provided to improve cooling characteristics.

According to the example embodiments, the heat diffusion part, which is the same as the semiconductor chip in thermal expansion coefficient and Young's modulus and is greater in thermal conductivity than the printed circuit board or the molding material, is disposed at the inside or one side of the printed circuit board to which the semiconductor chip is attached, so as to improve the heat diffusion characteristics and prevent the bending of the semiconductor package. Thus, the reliability of the stacked semiconductor package and the reliability of a semiconductor module including the stacked semiconductor package can be improved.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A stacked semiconductor package comprising:
   a first printed circuit board including a first surface upon which a first semiconductor chip is mounted and a second surface upon which at least one connecting structure is attached, the first printed circuit board further including at least one thermal via and a heat sink, the at least one thermal via and the heat sink being disposed under the first semiconductor chip with the heat sink being disposed between the first surface and the second surface; and
   a second printed circuit board including a third surface upon which a second semiconductor chip is mounted, the second printed circuit board being disposed under the first printed circuit board, the at least one connecting structure connecting the first printed circuit board to the second printed circuit board.

2. The stacked semiconductor package of claim 1, wherein the heat sink includes a material having a substantially same coefficient of thermal expansion as the first semiconductor chip.

3. The stacked semiconductor package of claim 2, wherein the heat sink includes one of copper, copper alloy, and aluminum.

4. The stacked semiconductor package of claim 1, wherein the thermal vias extend from a lower surface of the heat sink towards the second surface of the printed circuit board.

5. The stacked semiconductor package of claim 1, wherein the heat sink is arranged within the first printed circuit board at a position corresponding to the first semiconductor chip, and has an area corresponding to the first semiconductor chip.

6. The stacked semiconductor package of claim 1, further comprising:
   a molding material covering at least one portion of the second semiconductor chip and defining at least one molding via hole exposing an upper surface of the second semiconductor chip; and
   at least one molding via formed of a thermal conductive material filling the at least one molding via hole.

7. The stacked semiconductor package of claim 6, wherein the at least one molding via hole exposes at least one redistribution pad on the upper surface of the second semiconductor chip.

8. The stacked semiconductor package of claim 7, wherein the second semiconductor chip is connected to the second printed circuit board by bonding wires.

9. The stacked semiconductor package of claim 6, wherein the at least one molding via forms one of an inter-metal coupled substance and an inter-metal compound between the at least one molding via and the redistribution pad.

10. The stacked semiconductor package of claim 6, further comprising:
    at least one sub-solder ball between the first printed circuit board and the molding material and connected to the at least one molding via.

11. The stacked semiconductor package of claim 10, further comprising:
a heat diffusion material between the heat sink of the first printed circuit board and the third surface of the second semiconductor chip,
wherein the heat diffusion material has an electrically insulating material and surrounds the at least one sub-solder ball.

12. The stacked semiconductor package of claim 11, wherein the at least one molding via is directly connected to the at least one sub-solder ball.

13. The stacked semiconductor package of claim 10, wherein the at least one sub-solder ball is connected to the at least one thermal via of the first printed circuit board.

14. The stacked semiconductor package of claim 1, further comprising:
a heat diffusion material between the heat sink of the first printed circuit board and the third surface of the second semiconductor chip.

15. The stacked semiconductor package of claim 1, wherein the second printed circuit board includes at least one thermal via and a heat sink under the second semiconductor chip.

16. The stacked semiconductor package of claim 15, wherein the heat sink of the second printed circuit board includes a material having a same thermal expansion coefficient as the second semiconductor chip.

17. The stacked semiconductor package of claim 1, wherein the first semiconductor chip includes a memory device, and the second semiconductor chip includes a logic device.

18. The stacked semiconductor package of claim 1, wherein the heat sink includes a layer arranged between the first surface and the second surface.

19. The stacked semiconductor package of claim 18, wherein the heat sink further includes thermal posts extending from the layer to the first surface.

20. The stacked semiconductor package of claim 1, wherein the second surface includes a recess with the at least one thermal via extending into the recess and the second printed circuit board includes a heat diffusion material on the second semiconductor chip, the heat diffusion material being in contact with the at least one thermal via.

* * * * *